(12) United States Patent
Du et al.

(10) Patent No.: US 12,266,599 B2
(45) Date of Patent: Apr. 1, 2025

(54) DRIVE CIRCUIT CARRIER AND DISPLAY DEVICE

(71) Applicant: GUANGZHOU GOVISIONOX TECHNOLOGY CO., LTD., Guangdong (CN)

(72) Inventors: Lijian Du, Guangdong (CN); Hong Zheng, Guangdong (CN)

(73) Assignee: GUANGZHOU GOVISIONOX TECHNOLOGY CO., LTD., Guangzhou (CN)

( * ) Notice: Subject to any disclaimer, the term of this patent is extended or adjusted under 35 U.S.C. 154(b) by 297 days.

(21) Appl. No.: 18/070,811

(22) Filed: Nov. 29, 2022

(65) Prior Publication Data

US 2023/0114902 A1    Apr. 13, 2023

Related U.S. Application Data

(63) Continuation of application No. PCT/CN2021/099245, filed on Jun. 9, 2021.

(30) Foreign Application Priority Data

Sep. 24, 2020 (CN) .......................... 202011017336.0

(51) Int. Cl.
H05K 1/18       (2006.01)
H01L 23/498    (2006.01)

(52) U.S. Cl.
CPC .... H01L 23/49838 (2013.01); H01L 23/4985 (2013.01)

(58) Field of Classification Search
CPC .............. H01L 23/49838; H01L 23/4985

USPC ........................................................ 361/749
See application file for complete search history.

(56) References Cited

U.S. PATENT DOCUMENTS

2002/0080266 A1* 6/2002 Shinomiya ........... H05K 1/0268
                                                      348/374
2015/0305643 A1* 10/2015 Negi .................... A61B 5/6846
                                                      29/854
2015/0362455 A1* 12/2015 Moore ............... G01N 27/3272
                                                    29/610.1

FOREIGN PATENT DOCUMENTS

| CN | 1521536   | A | 8/2004  |
|----|-----------|---|---------|
| CN | 102708771 | A | 10/2012 |
| CN | 104298039 | A | 1/2015  |
| CN | 207753912 | U | 8/2018  |
| CN | 109188810 | A | 1/2019  |
| CN | 111354713 | A | 6/2020  |
| CN | 111443539 | A | 7/2020  |
| CN | 111584456 | A | 8/2020  |
| CN | 112270907 | A | 1/2021  |

OTHER PUBLICATIONS

Office Action issued on Aug. 19, 2021, in corresponding Chinese Application No. 202011017336.0, 19 pages.

(Continued)

*Primary Examiner* — Binh B Tran
(74) *Attorney, Agent, or Firm* — Maier & Maier, PLLC

(57) ABSTRACT

A drive circuit carrier and a display device. The drive circuit carrier includes a flexible substrate; and first test leads and second test leads, alternately staggered on a first surface of the flexible substrate in sequence. A first end of each first test lead is flush with a first edge of the first surface, and a second end of each second test lead is away from the first edge relative to the first end.

20 Claims, 3 Drawing Sheets

(56) References Cited

OTHER PUBLICATIONS

Office Action issued on Mar. 11, 2022, in corresponding Chinese Application No. 202011017336.0, 9 pages.
Notification to Grant Patent Right for Invention, in corresponding Chinese Application No. 202011017336.0, 6 pages.
International Search Report and Written Opinion issued on Aug. 13, 2021, in corresponding International Application No. PCT/CN2021/099245, 13 pages.

* cited by examiner

DRIVE CIRCUIT CARRIER AND DISPLAY DEVICE

CROSS REFERENCE

The present application is a continuation-application of International (PCT) Patent Application No. PCT/CN2021/099245, filed on Jun. 9, 2021, which claims priority of Chinese Patent Application No. 202011017336.0, filed on Sep. 24, 2020, the entire contents of which are hereby incorporated by reference in its entirety.

TECHNICAL FIELD

The present disclosure relates to the field of display technologies, and in particular to a drive circuit carrier and a display device.

BACKGROUND

As the resolution of a display panel gradually increases, the number of signals inside the panel gradually increases, making the density of test leads on the driver circuit carrier inside the display panel gradually increase. After punching and cutting the driver circuit carrier, adjacent test leads are likely to overlap, resulting in a short circuit between the test leads on the driver circuit carrier and reducing the yield of the driver circuit carrier.

SUMMARY

An embodiment adopted by the present disclosure is to provide a drive circuit carrier, comprising: a flexible substrate; and first test leads and second test leads, alternately staggered on a first surface of the flexible substrate in sequence; wherein a first end of each first test lead is flush with a first edge of the first surface, and a second end of each second test lead is away from the first edge relative to the first end.

Another embodiment adopted by the present disclosure is to provide a display device, comprising: a display screen, arranged with a boding region on an edge of the display screen; and the above-mentioned drive circuit carrier connected to the bonding region.

The embodiment of the present disclosure provides a drive circuit carrier, comprising: a flexible substrate; and first test leads and second test leads, alternately staggered on a first surface of the flexible substrate in sequence; wherein a first end of each first test lead is flush with a first edge of the first surface, and a second end of each second test lead is away from the first edge relative to the first end. In other words, from the first edge of the first surface of the flexible substrate, ends of two test leads adjacent to each other on the left and right are not flush, the first end of the first test lead is flush with the first edge, and the second end of the second test lead is inwardly retracted by a certain distance relative to the first edge. When punching the drive circuit carrier, the second test lead will not be punched and will not be deformed. If the first test lead is deformed after being punched, it is difficult for the first end to lap to the adjacent second end due to the inward shrinkage of the second end, thereby reducing the probability of short circuit between the test leads on the drive circuit carrier and improving the yield of the drive circuit carrier.

DETAILED DESCRIPTION

The technical solutions in the embodiments of the present disclosure will be clearly and completely described below with reference to the drawings in the embodiments of the present disclosure. Obviously, the described embodiments are only a part of the embodiments of the present disclosure, but not all of the embodiments. Based on the embodiments in the present disclosure, all other embodiments obtained by those skilled in the art without creative efforts shall fall within the scope of the present disclosure.

Figure 1:
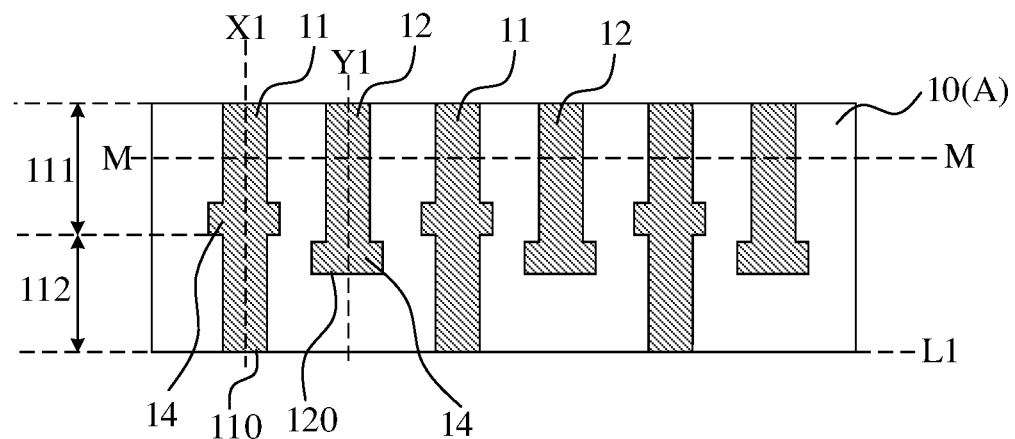
FIG. 1 is a schematic top structural view of a drive circuit carrier according to an embodiment of the present disclosure.

Referring to FIG. 1, a driving circuit carrier includes a flexible substrate 10, first test leads 11 and second test leads 12. Specifically, the first test leads 11 and the second test leads 12 are alternately staggered on a first surface A of the flexible substrate 10 in sequence. A first end 110 of each first test lead 11 is flush with a first edge L1 of the first surface A, and a second end 120 of each second test lead 12 is away from the first edge L1 relative to the first end 110. In some embodiments, the material of the first test leads 11 and the material of the second test leads 12 include copper, and in other embodiments, the surface of the copper may be coated with gold or nickel to prevent the copper from being oxidized.

There is a blank region of a certain length between the second end 120 and the first edge L1. That is, on a side with the first edge L1, the length of the first test lead 11 is greater than the length of the second test lead 12. When the driving circuit carrier is punched and cut along the first edge L1, the second test leads 12 are not punched, and the first test leads 11 are punched from a position of the first end 110. Even if a first test lead 11 deforms at the position of the first end 110 and laps crookedly, the first test lead 11 will lap to the blank region between the second end 120 and the first edge L1 and will not lap to the second test leads 12 adjacent to the first test lead 11 on the left and right. Therefore, the present disclosure can reduce the probability of short circuit between the test leads on the driving circuit carrier, and improve the yield of the driving circuit carrier.

Figure 2:
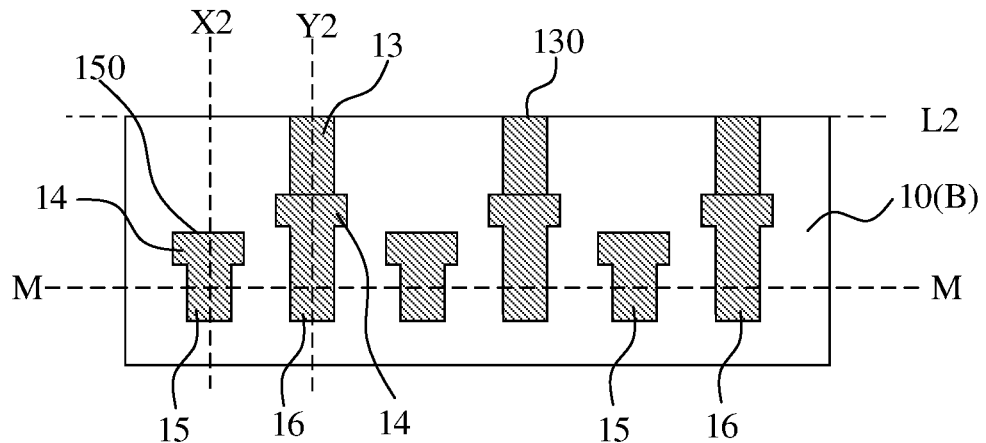
FIG. 2 is a schematic bottom view of a structure of the drive circuit carrier in FIG. 1.
Figure 3:
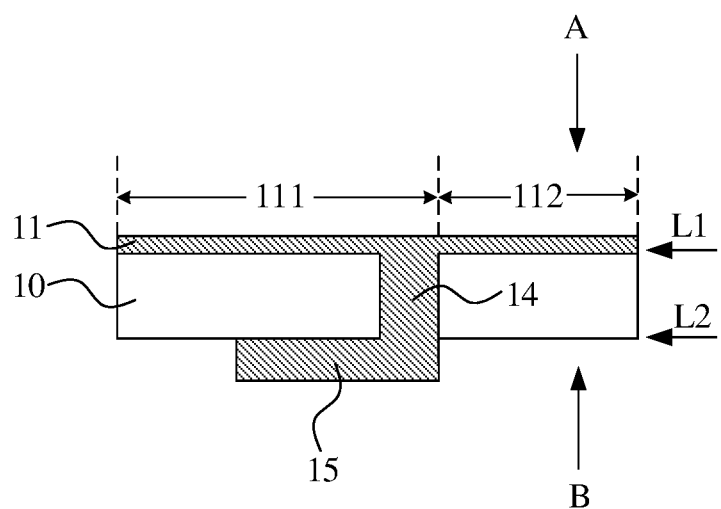
FIG. 3 is a schematic side view of a structure of the drive circuit carrier in FIG. 1.
Figure 4:
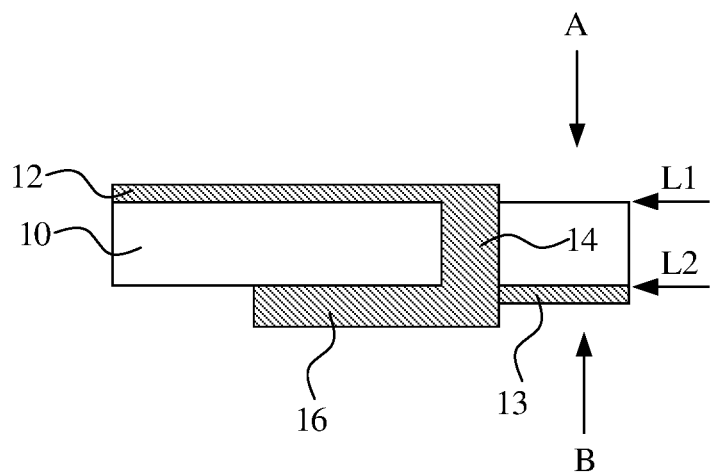
FIG. 4 is another schematic side view of a structure of the drive circuit carrier in FIG. 1.

Referring to FIG. 2 to FIG. 4, specifically, an orthographic projection of a broken line X1 in FIG. 1 on the flexible substrate 10 is coincident with an orthographic projection of a broken line X2 in FIG. 2 on the flexible substrate 10; an orthographic projection of a broken line Y1 in FIG. 1 on the flexible substrate 10 is coincident with an orthographic projection of a broken line Y2 in FIG. 2 on the flexible substrate 10. FIG. 3 is a side view along the broken line X1 and the broken line X2 in FIGS. 1 and 2. As shown in FIG. 3, the first test lead 11 is disposed on the first surface A, and the first edge L1 and a second edge L2 are disposed on a right end of FIG. 3. FIG. 4 is a side view along the broken line Y1 and the broken line Y2 in FIGS. 1 and 2. As shown in FIG. 4, the second test lead 12 is disposed on the first surface A, and the first edge L1 and the second edge L2 are disposed on a right end of FIG. 4.

In the embodiments, the driving circuit carrier further includes auxiliary test lines 13 disposed on a second surface B of the flexible substrate 10. The second surface B is disposed opposite to the first surface A, the first surface A and the second surface B being two main surfaces of the flexible substrate 10. A third end 130 of each auxiliary test line 13 is flush with the second edge L2 of the second surface B, and each second test lead 12 is electrically connected to a corresponding auxiliary test line 13, such that the second test lead 12 may be tested through the auxiliary test line 13. The auxiliary test lines 13 are connected to test pads (not shown), so as to perform external testing on the second test leads 12. Specifically, the flexible substrate 10 is arranged with a plurality of conductive holes 14 extending through the first surface A and the second surface B, disposed at positions of the second ends 120, such that the second test leads 12 are electrically connected to the auxiliary test lines 13.

The second edge L2 and the first edge L1 are two opposite edges located on a same side of the flexible substrate 10, and the side including the first edge L1 and the second edge L2 is a side where the driving circuit carrier is punched and cut, located on the right end of FIGS. 3 and 4. It can be seen from FIG. 1 and FIG. 3 that the first end 110 of the first test lead 11 is flush with the first edge L1, and there is a blank region between the second end 120 of the second test lead 12 and the first edge L1.

The first test leads 11 and the second test leads 12 distributed on the first surface A are configured to electrically connect the driver circuit carrier with an IC chip and test the IC chip. When the driver circuit carrier is being punched and cut, lead bodies of test leads are not expected to be cut. Based on this, in the embodiments, each first test lead 11 includes a lead body 111 and an extension test lead 112 that are electrically connected to each other. The lead body 111 is away from the first edge L1 relative to the extension test lead 112, that is, the first end 110 is disposed at an end of the extension test lead 112 away from the lead body 111. The lead body 111 may be tested through the corresponding extension test lead 112, and the extension test lead 112 is connected to a test pad not shown in the figure, such that the first test lead 11 is externally tested. The second test lead 12 may be tested through the auxiliary test line 13 on the second surface B. After the test, during the punching and cutting process of the driver circuit carrier, punching may be performed from the position of the extension test lead 112 and the auxiliary test line 13. Therefore, the lead body 111 and the second test line 12 will not be punched out. Moreover, even if the extension test lead 112 and the auxiliary test line 13 are deformed and skewed after being punched, they are lapped to the blank region adjacent to the left and right or top and bottom, without making the adjacent first test lead 11 and second test lead 12 lap each other, thereby reducing the chance of short circuit between the test leads on the driver circuit carrier and improving the yield of the driver circuit carrier.

Figure 5:
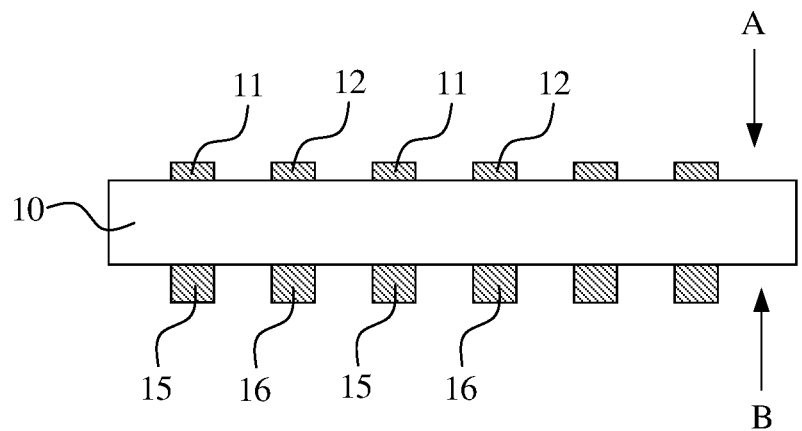
FIG. 5 is a schematic cross-sectional view of a structure of the drive circuit carrier in FIG. 1.
Figure 6:
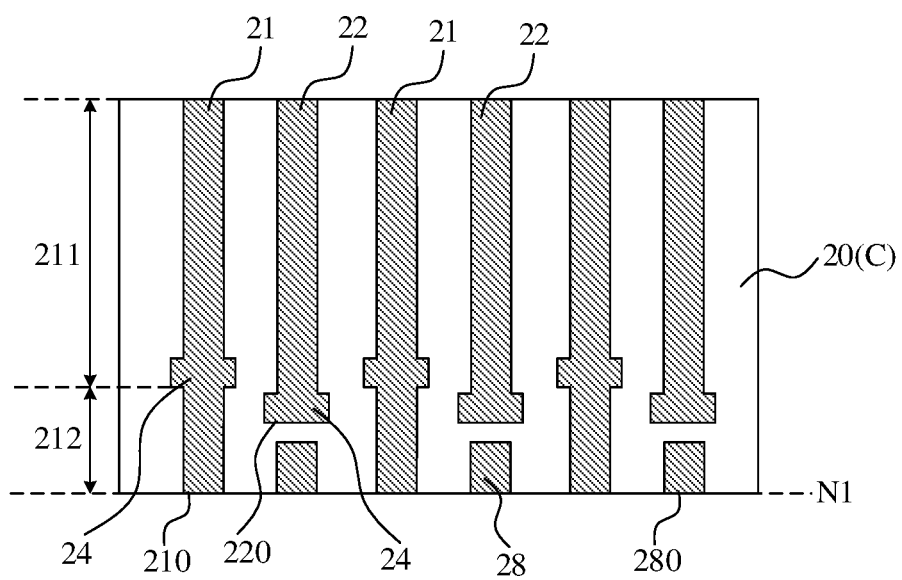
FIG. 6 is a schematic top view of a structure of a drive circuit carrier according to another embodiment of the present disclosure.
Figure 7:
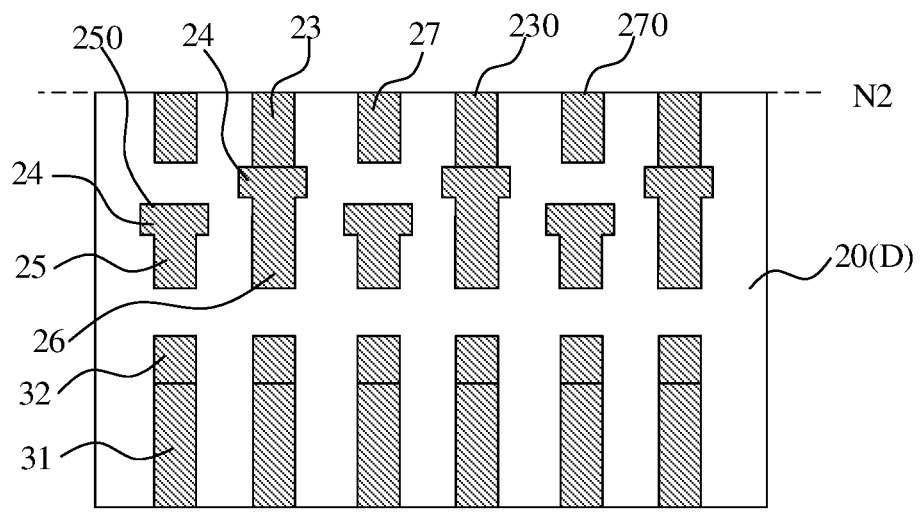
FIG. 7 is a schematic bottom view of a structure of the drive circuit carrier in FIG. 6.

Further, referring to FIG. 5, FIG. 5 is a schematic cross-sectional structural view of the drive circuit carrier in FIG. 1, and specifically a cross-sectional view along the M-M direction in FIG. 1. In this embodiment, the driving circuit carrier further includes first driving leads 15 and second driving leads 16.

As shown in FIG. 2 and FIG. 3, each first driving lead 15 is disposed on the second surface B, at least partially overlapping with a projection of a corresponding first test lead 11 on the flexible substrate 10. A fourth end 150 of the first driving lead 15 is away from the second edge L2, that is, the fourth end 150 of the first driving lead 15 facing the second edge L2 is retracted by a certain distance relative to the second edge L2, and there is a blank region between the fourth end 150 and the second edge L2. The first driving lead 15 is electrically connected to the corresponding first test lead 11, such that the first test lead 11 is electrically connected to other components, such as a display screen, through the first driving lead 15. Specifically, the conductive hole 14 is also arranged at a position of the fourth end 150, such that the first driving lead 15 is electrically connected to the first test lead 11. It can be seen that the conductive hole 14 at the position of the fourth end 150 electrically connects the first test lead 11 (including the lead body 111 and the extension test lead 112) and the first driving lead 15, such that the lead body 111 may be tested through the extension test lead 112 and be electrically connected to other components through the first driving lead 15.

As shown in FIG. 2 and FIG. 4, each second driving lead 16 is disposed on the second surface B, at least partially overlapping with a projection of a corresponding second test lead 12 on the flexible substrate 10. The second driving lead 16 is disposed in a same column as a corresponding auxiliary test line 13 and is electrically connected to the auxiliary test line 13, such that the second test lead 12 is electrically connected to other components, such as the display screen, through the second driving lead 16. That is, the conductive hole 14 at the position of the second end 120 electrically connects the second test lead 12 located on the first surface A with the second driving lead 16 and the auxiliary test line 13 located on the second surface B, such that the second test lead 12 is electrically connected to other components through the second driving lead 16 and tested through the auxiliary test line 13.

In some embodiments, as shown in FIG. 1 and FIG. 2, in a direction perpendicular to the first test lead 11, the plurality of conductive holes 14 are arranged in a staggered manner, such that the probability of short circuit between adjacent conductive holes 14 may be reduced, and the wiring on the flexible substrate 10 is more compact and reasonable. In addition, the material of the conductive hole 14 may be the same as the material of the first test lead 11 and the second test lead 12, and the size of the conductive hole 14 may be larger than the size of the first test lead 11 or the second test lead 12 to reduce the conductive resistance of the conductive hole 14, thereby increasing the stability of the electrical connection through the conductive hole 14.

In summary, taking the first test lead 11 at the upper left corner in FIG. 5 as an example, a right side adjacent to the first test lead 11 is arranged with the second test lead 12 retracted relative to the first edge L1, and a lower side adjacent to the first test lead 11 is arranged with the first driving lead 15 retracted relative to the second edge L2. After the driving circuit carrier is punched and cut, even if the extension test lead 112 of the first test lead 11 is deformed and skewed, since there are no other lines at the adjacent position on the right or the lower side, the first test lead 11 is not prone to connecting to the second test lead 12 or the first driving lead 15 adjacent thereto on the right or lower side. Therefore, the present embodiments may reduce the probability of short circuit between the leads on the driving circuit carrier and improve the yield of the driving circuit carrier.

Referring to FIG. 6 to FIG. 9, which illustrate another embodiment of the driving circuit carrier of the present disclosure, the arrangement of FIGS. 6 to 9 is the same as that of the above-mentioned FIGS. 1 to 4.

Similar to the embodiments shown in FIGS. 1 to 5, the driving circuit carrier in this embodiment includes a flexible substrate 20, first test leads 21 and second test leads 22. Specifically, the first test leads 21 and the second test leads 22 are alternately staggered on a first surface C of the flexible substrate 20 in sequence. A first end 210 of each first test lead 21 is flush with a first edge N1 of the first surface C, and a second end 220 of each second test lead 22 is away from the first edge N1 relative to the first end 210. In some embodiments, the material of the first test leads 21 and the material of the second test leads 22 include copper, and in other embodiments, the surface of the copper may be coated with gold or nickel to prevent the copper from being oxidized.

Further, similar to the above-mentioned embodiments, the driving circuit carrier in the embodiments further includes auxiliary test lines 23, first driving leads 25 and second driving leads 26.

The auxiliary test lines 23 are located on a second surface D of the flexible substrate 20. The second surface D is disposed opposite to the first surface C. A third end 230 of each auxiliary test line 23 is flush with a second edge N2 of the second surface D, and each auxiliary test line 23 is electrically connected to a corresponding second test lead 22 through a conductive hole 24 at a position of the second end 220, such that the second test lead 22 may be tested through the auxiliary test line 23. The first test lead 21 includes a lead body 211 and an extension test lead 212 that are electrically connected to each other, and the lead body 211 is farther from the first edge N1 relative to the extension test lead 212.

Each first driving lead 25 is disposed on the second surface D, at least partially overlapping a projection of a corresponding first test lead 21 on the flexible substrate 20. A fourth end 250 of the first driving lead 25 is away from the second edge N2, and the first driving lead 25 is electrically connected to the corresponding first test lead 21 through the conductive hole 24 disposed at the fourth end 250, such that the first test lead 21 is electrically connected to other components through the first driving lead 25. Each second driving lead 26 is disposed on the second surface D, at least partially overlapping a projection of a corresponding second test lead 22 on the flexible substrate 20. The second driving lead 26 is disposed in a same column as a corresponding auxiliary test line 23 and is electrically connected to the auxiliary test line 23, such that the second test lead 22 is electrically connected to other components through the second driving lead 26.

Different from the above-mentioned embodiments, in these embodiments, the driving circuit carrier further includes first support lines 27 arranged on the second surface D and disposed in a column as a corresponding first driving lead 25. Each first support line 27 and the corresponding first driving lead 25 are spaced apart, and a fifth end 270 of the first support line 27 away from the corresponding first driving lead 25 is flush with the second edge N2. That is, the first support line 27 is partially overlapped with a projection of a corresponding extension test lead 212 of the first test lead 21 on the flexible substrate 20, and an end of the first support line 27 and an end of the extension test lead 212 are both flush with a side surface of the flexible substrate 20 that is punched out.

After setting the first support line 27, when the driver circuit carrier is being punched from positions of the first edge N1 and the second edge N2, since the first surface C and the second surface D of the punching position are both arranged with lead lines (the extension test lead 212 and the first support line 27), the punching stress is buffered, such that the probability of deformation and skew of the extension test lead 212 is reduced, and the probability of short circuit between the test leads on the driving circuit carrier may be reduced. Moreover, even if the extension test lead 212 is deformed and skewed, the extension test lead will only overlap the corresponding first support line 27 on the opposite side, and there is a space between the first support line 27 and the first driving lead 25, such that the extension test lead 21 will not short out even if it is lapped with the first support line 27. In this way, the probability of short circuit between the leads on the driving circuit carrier may be further reduced, and the yield of the driving circuit carrier may be improved.

Referring to FIGS. 6 to 9, the driver circuit carrier of the present disclosure may further include second support lines 28 disposed on the first surface C and disposed in a same column as a corresponding second test lead 22. The second support line 28 and the second test lead 22 are spaced apart, and a sixth end 280 of the second support line 28 away from the second test lead 22 is flush with the first edge N1.

When the driving circuit carrier is being punched from the positions of the first edge N1 and the second edge N2, since the first surface C and the second surface D of the punching position are both arranged with lead lines (the extension test lead 212, the first support line 27, the second support line 28 and the auxiliary test line 23), the punching stress is buffered, such that the probability of deformation and skew of the extension test lead 212 and the auxiliary test line 23 is reduced, thereby reducing the probability of short circuit between the test leads on the drive circuit carrier. Moreover, even if the extension test lead 212 is deformed and skewed, the extension test lead 212 will only overlap the corresponding first support line 27 on the opposite surface or the corresponding second support line 28 adjacent thereto on the same side. Even if the auxiliary test line 23 is deformed and skewed, the auxiliary test line 23 will only overlap the adjacent first support line 27 on the same side or the second support line 28 on the opposite side. There is a space between the first support line 27 and the first driving lead 25, and there is a space between the second support line 28 and the second test lead 22, such that the extension test lead 212 or the auxiliary test line 23 may not be short-circuited even if it laps with the first support line 27 or the second support line 28, thereby further reducing the probability of short-circuiting between leads on the driver circuit carrier and improving the yield of the driver circuit carrier.

It can be understood that, in different embodiments, only the first support line 27 or the second support line 28 may be arranged, or the first support line 27 and the second support line 28 may be arranged at the same time.

Referring to FIG. 6 to FIG. 9, the drive circuit carrier may further include third test leads 31 and third driving leads 32, which are disposed on the second surface D. Each third test lead 31 is electrically connected to a corresponding third driving lead 32, such that the third test lead 31 is electrically connected to other elements through the third driving lead 32. The third test lead 31 and the third driving lead 32 that are electrically connected to each other are disposed in an extension direction of a corresponding first driving lead 25 away from the second edge N2, and/or are disposed in an extension direction of a corresponding second driving lead 26 away from the second edge N2. Each third driving lead 32 is spaced apart from the first driving lead 25 or the second driving lead 26. The third test leads 31 are only configured for electrical connection with the IC chip and not required to be tested.

Figure 8:
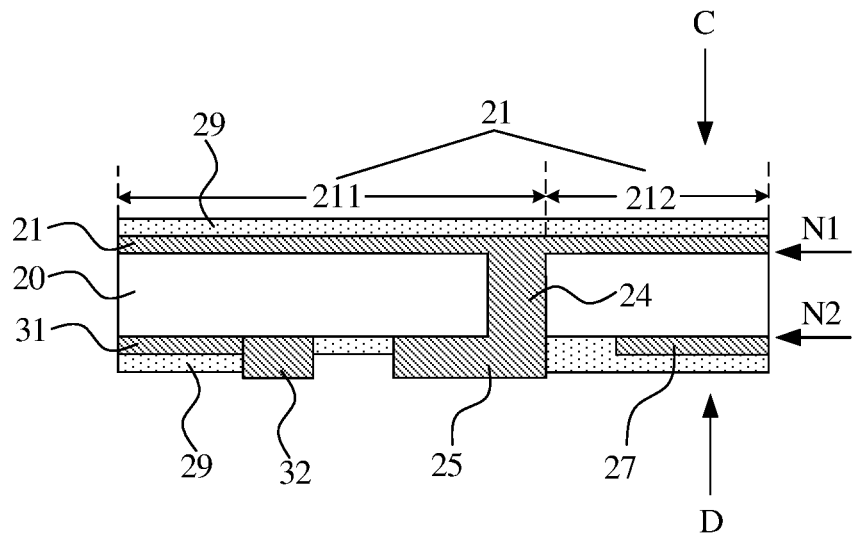
FIG. 8 is a schematic side view of a structure of the drive circuit carrier in FIG. 6.
Figure 9:
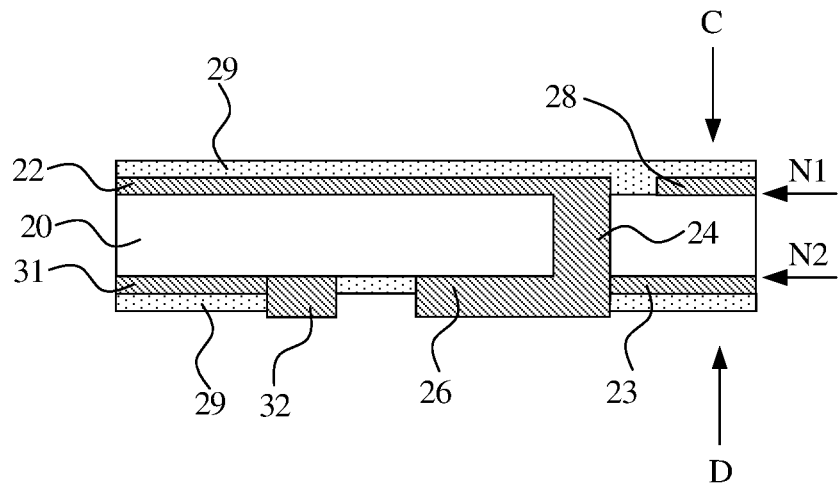
FIG. 9 is another schematic side view of a structure of the drive circuit carrier in FIG. 6.

That is, on a left end of the second surface D in FIG. 8 and FIG. 9, there are a plurality of third test leads 31 and third driving leads 32 distributed, which may only correspond to the first test leads 21 disposed on the first surface C, or only correspond to the second test leads 22, or correspond to the first test leads 21 and the second test leads 22 at the same time. Specifically, the arrangement may be designed according to the wiring requirements of the driving circuit carrier.

It can be seen from the above that the first driving leads 25, the second driving leads 26 and the auxiliary test lines 23 are all distributed on the second surface D. The first driving lead 25 and the second driving lead 26 are configured to lead the first test lead 21 and the second test lead 22 distributed on the first surface C, respectively, to the second surface D through the corresponding conductive holes 24 to be electrically connected with other components. The auxiliary test line 23 is configured to test the second test lead 22 on the second surface D. The lengths of the first driving lead 25, of the second driving lead 26, and of the auxiliary test line 23 are each less than the length of the first test lead 21 and the length of the second test lead 22. Therefore, on the second surface D, in the extending direction of the first driving lead 25 and the second driving lead 26 away from the first edge N1 and the second edge N2 (i.e., the left end of the second surface D in FIG. 8 and FIG. 9), there is plenty of space that can be used to arrange the third test lead 31 and the third driving lead 32, which is suitable for a drive circuit carrier with more internal leads and a higher lead density.

Further, referring to FIG. 6-FIG. 9, the driver circuit carrier of the present disclosure further includes an insulating layer 29 (the insulating layer 29 is not shown in both FIG. 6 and FIG. 7), covering the first surface C and part of the second surface D. An opening (not shown) is defined on the insulating layer 29 on the second surface D to expose the first driving lead 25 and second driving lead 26. In some embodiments, when the second surface D is further arranged with the third driving lead 32, the opening on the insulating layer 29 further exposes the third driving lead 32. Of course, in the embodiments shown in FIGS. 1 to 5, an insulating layer may also be arranged on the first surface A and the second surface B. The insulating layer is configured to protect all lines on the driving circuit carrier, avoid unnecessary conduction during the working process of the driving circuit carrier, and improve the reliability of the driving circuit carrier.

In addition, the present disclosure further provides a display device, including a display screen and the driving circuit carrier described in any one of the above embodiments. A bonding region is arranged on an edge of the display screen, and the driving circuit carrier is electrically connected with the bonding region. It can be seen from the above-mentioned embodiments that the first driving lead and the second driving lead are arranged on the second surface of the flexible substrate in the driving circuit carrier of the present disclosure, and are respectively configured to lead the first test lead and the second test lead arranged on the first surface to the second surface through conductive holes for electrical connection with other components, respectively. In some embodiments, the second surface is further arranged with the third driving lead for electrically connecting the third test lead arranged on the same surface with other components. In the display device provided by the present disclosure, the display screen belongs to the other components mentioned above, and the driving circuit carrier is electrically connected to the bonding region of the display screen through the first drive lead and the second drive lead on the second surface, and/or the third drive lead.

In the display device provided by the present disclosure, the reliability of the driving circuit carrier is high, such that the reliability of the display device is high and the performance is better.

The above description is only an embodiment of the present disclosure, and is not intended to limit the scope of the present disclosure. Any equivalent structure or equivalent process transformation made by using the contents of the specification and the accompanying drawings, or applied directly or indirectly in other related technical fields, is included within the scope of the present disclosure.

What is claimed is:

1. A drive circuit carrier, comprising:
    a flexible substrate;
    first test leads and second test leads, alternately staggered on a first surface of the flexible substrate in sequence, wherein a first end of each first test lead is flush with a first edge of the first surface, and a second end of each second test lead is away from the first edge relative to the first end; and
    auxiliary test lines, disposed on a second surface of the flexible substrate, wherein the second surface is disposed opposite to the first surface.

2. The drive circuit carrier according to claim 1, wherein a third end of each auxiliary test line is flush with a second edge of the second surface, each second test lead is electrically connected to a corresponding auxiliary test line to be tested through the corresponding auxiliary test line, and the second edge and the first edge are two opposite edges located on a same side of the flexible substrate.

3. The drive circuit carrier according to claim 1, wherein each first test lead comprises a lead body and an extension test lead that are electrically connected to each other, the lead body is away from the first edge relative to the extension test lead, and the lead body is tested through the extension test lead.

4. The drive circuit carrier according to claim 2, further comprising:
    first driving leads, disposed on the second surface and at least partially overlapping with a projection of a corresponding first test lead on the flexible substrate, wherein a fourth end of each first driving lead is away from the second edge and is electrically connected to the corresponding first test lead, such that the corresponding first test lead is electrically connected to another component through the each first driving lead.

5. The drive circuit carrier according to claim 4, further comprising:
    second driving leads, each disposed on the second surface and at least partially overlapping with a projection of a corresponding second test lead on the flexible substrate, wherein each second driving lead is disposed in a same column as a corresponding auxiliary test line and is electrically connected to the corresponding auxiliary test line, such that the corresponding second test lead is electrically connected to another component through the each second driving lead.

6. The drive circuit carrier according to claim 5, wherein the flexible substrate is arranged with a plurality of conductive holes extending through the first surface and the second surface, a first subset of the plurality of conductive holes is disposed at positions of the second ends of the second test leads, and a second subset of the plurality of conductive holes is disposed at positions of the fourth ends of the first driving leads, such that the each first driving lead is electrically connected to the corresponding first test lead, and each second test lead is electrically connected to the corresponding auxiliary test line and a corresponding second driving lead.

7. The drive circuit carrier according to claim 6, wherein the plurality of conductive holes is arranged in a staggered manner in a direction perpendicular to the first test leads.

8. The drive circuit carrier according to claim 6, wherein a material of each conductive hole is the same as a material of each first test lead and each second test lead.

9. The drive circuit carrier according to claim 6, wherein a size of each conductive hole is larger than a size of a corresponding first test lead or a size of a corresponding second test lead.

10. The drive circuit carrier according to claim 4, further comprising:
first support lines, each arranged on the second surface and disposed in a column as a corresponding first driving lead, wherein each first support line and the corresponding first driving lead are spaced apart, and a fifth end of the each first support line away from the corresponding first driving lead is flush with the second edge.

11. The drive circuit carrier according to claim 1, further comprising:
second support lines, each disposed on the first surface and disposed in a same column as a corresponding second test lead, wherein each second support line and the corresponding second test lead are spaced apart, and a sixth end of the each second support line away from the corresponding second test lead is flush with the first edge.

12. The drive circuit carrier according to claim 5, further comprising
an insulating layer covering the first surface and a part of the second surface, wherein an opening is defined on the insulating layer on the second surface to expose the first driving leads and the second driving leads.

13. The drive circuit carrier according to claim 5, further comprising:
third test leads and third driving leads, disposed on the second surface, wherein each third test lead is electrically connected to a corresponding third driving lead, such that the each third test lead is electrically connected to another element through the corresponding third driving lead.

14. The drive circuit carrier according to claim 13, wherein each third test lead and corresponding third driving lead are disposed in an extension direction of a corresponding first driving lead away from the second edge and spaced apart from the corresponding first driving lead.

15. The drive circuit carrier according to claim 13, wherein each third test lead and corresponding third driving lead are disposed in an extension direction of a corresponding second driving lead away from the second edge and spaced apart from the corresponding second driving lead.

16. The drive circuit carrier according to claim 1, wherein a material of each first test lead comprises at least one of copper, gold, or nickel.

17. The drive circuit carrier according to claim 1, wherein a material of each second test lead comprises at least one of copper, gold, or nickel.

18. A display device, comprising:
a display screen, arranged with a bonding region on an edge of the display screen; and
a drive circuit carrier, connected to the bonding region;
wherein the drive circuit carrier comprises:
a flexible substrate;
first test leads and second test leads, alternately staggered on a first surface of the flexible substrate in sequence, wherein a first end of each first test lead is flush with a first edge of the first surface, and a second end of each second test lead is away from the first edge relative to the first end; and
auxiliary test lines, disposed on a second surface of the flexible substrate, wherein the second surface is disposed opposite to the first surface.

19. The display device according to claim 18, wherein
a third end of each auxiliary test line is flush with a second edge of the second surface, each second test lead is electrically connected to a corresponding auxiliary test line to be tested through the corresponding auxiliary test line, and the second edge and the first edge are two opposite edges located on a same side of the flexible substrate.

20. The display device according to claim 18, wherein each first test lead comprises a lead body and an extension test lead that are electrically connected to each other, the lead body is away from the first edge relative to the extension test lead, and the lead body is tested through the extension test lead.

* * * * *